(12) United States Patent
Dubey

(10) Patent No.: US 12,489,443 B2
(45) Date of Patent: Dec. 2, 2025

(54) LOW POWER DRIVER SCHEME FOR ON-CHIP AND INTERPOSER BASED DATA TRANSMISSION

(71) Applicant: XILINX, INC., San Jose, CA (US)

(72) Inventor: Hari Bilash Dubey, Hyderabad (IN)

(73) Assignee: XILINX, INC., San Jose, CA (US)

( * ) Notice: Subject to any disclaimer, the term of this patent is extended or adjusted under 35 U.S.C. 154(b) by 175 days.

(21) Appl. No.: 17/964,762

(22) Filed: Oct. 12, 2022

(65) Prior Publication Data
US 2024/0128974 A1  Apr. 18, 2024

(51) Int. Cl.
*H03K 17/687* (2006.01)

(52) U.S. Cl.
CPC ............................... *H03K 17/6872* (2013.01)

(58) Field of Classification Search
CPC ........... H03K 17/6872; H03K 19/0175; H03K 19/0185; H03K 19/018521
See application file for complete search history.

(56) References Cited

U.S. PATENT DOCUMENTS

| | | | |
|---|---|---|---|
| 9,197,460 B1 * | 11/2015 | Sindalovsky | G11C 29/022 |
| 9,231,631 B1 * | 1/2016 | Ke | H04L 25/0286 |
| 9,391,577 B2 * | 7/2016 | Stroet | H03G 1/0023 |
| 10,033,412 B2 * | 7/2018 | Lim | H03M 9/00 |
| 10,819,303 B1 * | 10/2020 | Park | H01L 25/18 |
| 2007/0047636 A1 * | 3/2007 | Lim | H04B 3/143 |
| | | | 375/229 |
| 2021/0152404 A1 * | 5/2021 | Levin | H04L 25/03146 |

* cited by examiner

*Primary Examiner* — Menatoallah Youssef
*Assistant Examiner* — Colleen J O Toole
(74) *Attorney, Agent, or Firm* — Patterson + Sheridan, LLP

(57) ABSTRACT

Signal routing and EMIR requirements are causing increased demand for metal resources. The cost of metal resources is also an issue. The design and sign-off of on-chip drivers for driving signals from one chip location to another is complicated by requirements for power integrity and signal routing. This disclosure addresses routing resource bottlenecks and power requirements by introducing a low power driver useable in a high speed SERDES scheme. A voltage clipping high speed and low swing driver is disclosed. Threshold switching voltage of the transmitted signal is controlled by a process and temperature compensated biasing scheme. A reference voltage generation circuitry along with a simple receiver demonstrates the capability of this receiver. This transceiver scheme can be used on an on-chip or off-chip SERDES application to send/receive low speed signals serially. Use of this novel technique addresses the metal resource issue along with EMIR and SIPI requirements.

20 Claims, 7 Drawing Sheets

LOW POWER DRIVER SCHEME FOR ON-CHIP AND INTERPOSER BASED DATA TRANSMISSION

TECHNICAL FIELD

Examples of the present disclosure generally relate to low power driver schemes, and, in particular, to a low power driver scheme for on chip and interposer based data transmission and signaling.

BACKGROUND

This disclosure addresses the problem of demand for costly metal resources for integrated circuitry signal routing, for Electro-Migration and IR drop (EMIR) and for Signal Integrity and Power Integrity (SIPI) requirements. The design and sign-off of On-Chip drivers responsible for driving the signals from one location of a chip to another location of a chip is becoming challenging due to competing requirements for power integrity and signal routing.

SUMMARY

A new method and circuitry is disclosed here for a low power data transmission driver. Standard voltage threshold data is input to an integrated circuitry or other circuitry. A voltage-controlled driver converts the standard voltage threshold data to low swing voltage level, non-return-to-zero (NRZ) data, which can then be transmitted over a transmission channel to a receiver. At the receiver, the NRZ data can then be converted back to standard voltage threshold data.

Use of the disclosed low power driver results in substantial reduction of power requirements in an integrated circuit or other circuitry.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

There is an ever-increasing demand for metal resources for signal routing and Electro-Migration and IR drop (EMIR) requirements, coupled with the problem of the cost of metal resources at lower technology nodes. Design and sign-off of On-chip drivers responsible for driving the signals from one location of a chip to another location of a chip is becoming challenging due to competing requirements for power integrity and signal routing. This problem is not limited solely within one chip. It is also a problem for general purpose and global signals sent from one chip to another using interposers.

This disclosure addresses the issue of routing resource bottleneck and power requirements by introducing a low power or reduced power driver which can be used in a high speed serializer-deserializer (SERDES) scheme.

A voltage clipping high speed and low swing driver is disclosed here. The threshold switching voltage of the transmitted signal is controlled by a process and temperature compensated biasing scheme. A reference voltage generation circuitry along with a simple receiver is also shown to demonstrate the capability of this driver.

This transceiver scheme can be used on on-chip, off-chip SERDES applications to send or receive low speed signals serially using the current transceivers.

High switching currents form in traditional drivers with rail to rail swings. This high current results in Electro-Migration (EM) violations with reliability concerns, and also high IR drops that can have functional timing implications By use of the novel technique disclosed here, metal resource limitations along with EMIR problems, and Signal Integrity and Power Integrity (SIPI) requirements are addressed.

Figure 1:
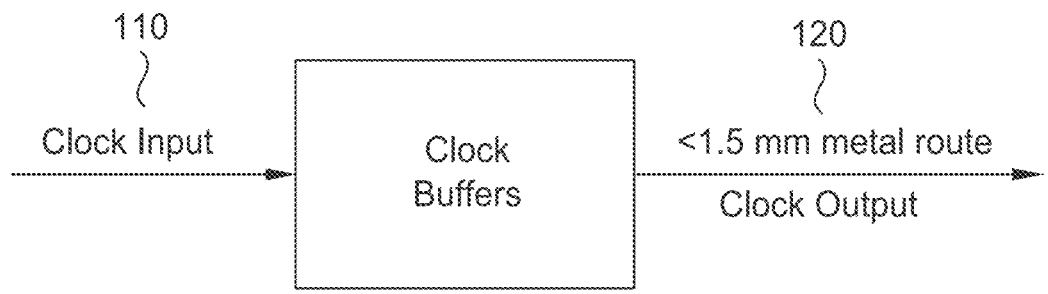
FIG. 1 illustrates an example, according to one example, of a High Speed Clock Driver.

FIG. 1 illustrates a prior-art high-speed clock driver. Clock signals are transmitted to the driver input 110, and then re-transmitted at the driver output 120. In one example, the length of the metal route is less than 1.5 mm. In other examples, the length of the metal route can be more than 1.5 mm if the resistivity of the metal is less, and if the resistance of the route is not dominant. There are several difficulties in designing these drivers using this scheme. Many repeaters cannot be used as each repeater inserts clock jitter into the clock signal. However, using a smaller number of repeaters results in a high capacitive load. This in turn results in a challenging EMIR closure for these drivers. Many dummy devices, de-cap interleaving, and other techniques demanding silicon resources are required to overcome the EMIR closure problem.

Figure 2:
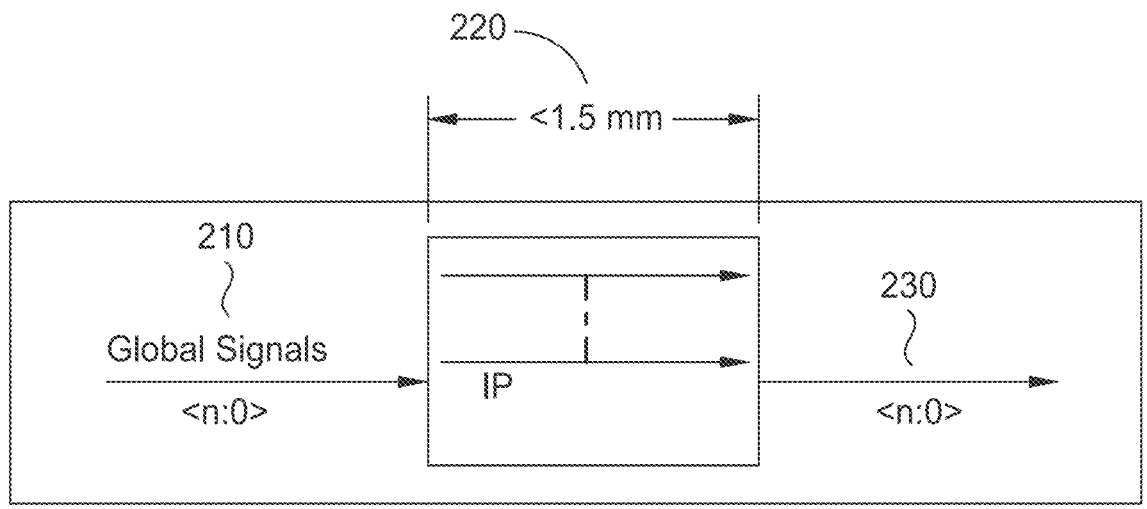
FIG. 2 illustrates an example, according to one example, of an On chip Global signal propagation.

FIG. 2 illustrates prior-art On chip Global signal propagation, ie the signaling requirements for on chip global signals. In this example, global signals 210 pass through metal lines 220 less than 1.5 mm in width, and then exit 230 the IP (intellectual property block). The metal lines 220 typically function as the connection circuitry between one chip to another. The maximum number n of these global signals 210 may be greater than 1000. For on-chip signaling, it is possible that the global signals need to cross an IP width of a few mm. It is possible that the IP does not provide porosity to route greater than 1000 signals due to the IP's metals's own signal and power requirements. This will then need to be addressed by increasing the width of the chip, translating directly into cost.

Figure 3:
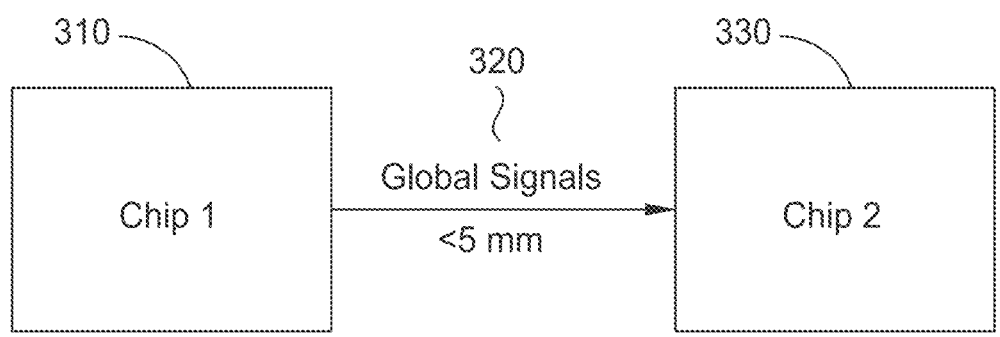
FIG. 3 illustrates an example, according to one example, of an Off chip Interposer Based Signaling.

FIG. 3 illustrates a prior-art Off chip Interposer Based Signaling design. Similar requirements as the off-chip Global signal propagation (FIG. 2) are possible for chip-to-chip interface for routing global signals using an Interposer 320. In this example, two chips, a first chip Chip 1 310 and a second chip Chip 2 330 are connected by an Interposer 320 of less than 5 mm width that conducts global signals. In other examples, the width of the Interposer may be more or less, depending on the resistance and capacitance of the metal and the operating frequency.

Figure 4:
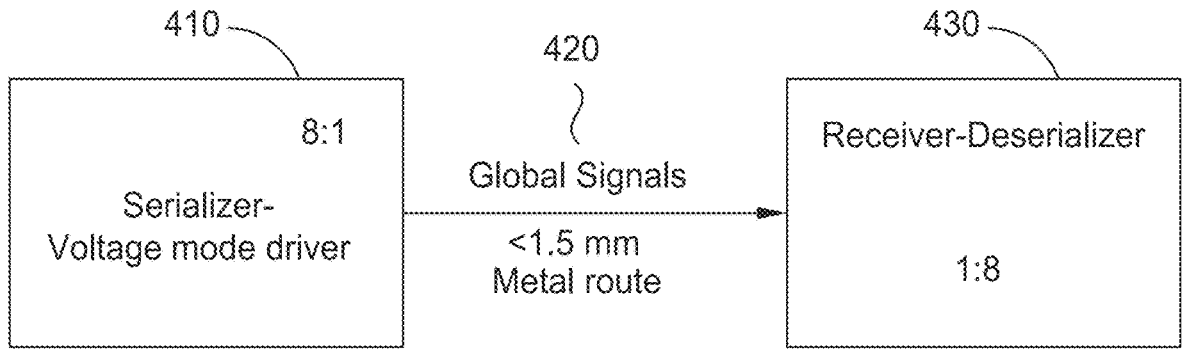
FIG. 4 illustrates an example, according to one example, of a Voltage Mode SERDES.
Figure 5:
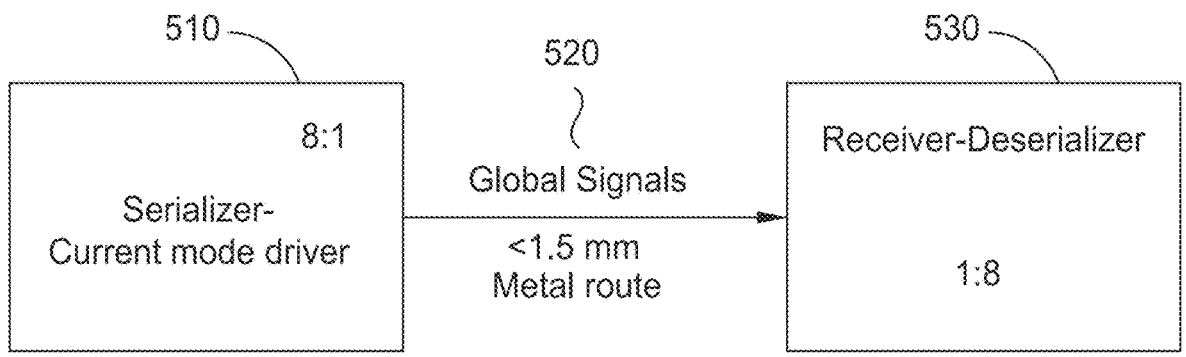
FIG. 5 illustrates an example, according to one example, of a Current Mode SERDES.

FIGS. 4-5 are illustrating prior-art on-chip transceivers.

FIG. 4 illustrates an example SERDES based approach for solving the problem of routing congestion by serializing the data and sending it though a high-speed voltage mode driver. Parallel, 8 bit data is serialized by a serializer-voltage mode driver 410, transmitted over a metal route 420 less than 1.5 mm long, and then converted back to 8 bit parallel data by a receiver-deserializer 430. The disadvantage of this approach is high power consumption demanding high routing resources, signal integrity and power integrity. Those skilled in the art may observe that this driver-receiver can be used for clock signaling as well, albeit with above limitations. As an example, Fmax (maximum operating frequency) for global signals is 500 MHz, and the driver needs to operate at 4 Gbps to make the new scheme work.

FIG. 5 illustrates another SERDES based approach to solving the metal congestion problem using a current mode driver. A current mode signaling scheme requires low energy while providing higher reliability. Parallel, 8 bit data is serialized by a serializer-current mode driver 510, then transmitted over a metal route 520 less than 1.5 mm long, and then converted back to parallel 8 bit data by a receiver-deserializer 530. The main difficulty with this kind of scheme is controlling the threshold switching voltage of the signal to reliably receive it on the other side.

Figure 6:
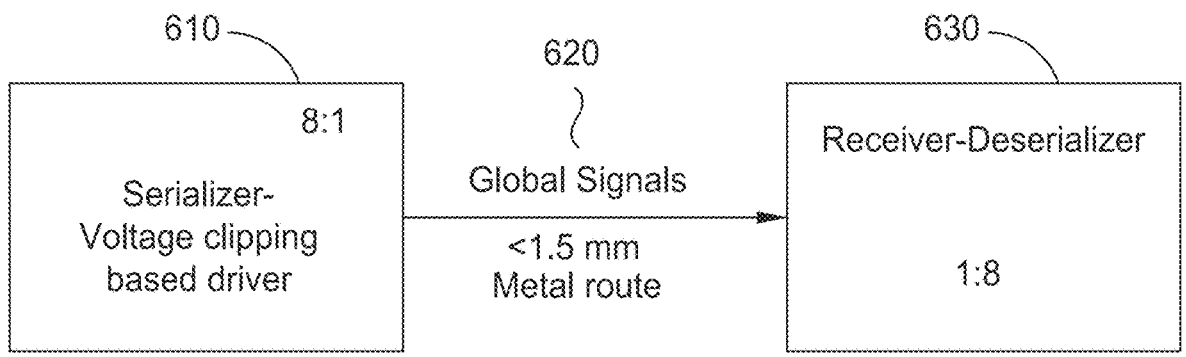
FIG. 6 illustrates an example, according to one example, of a Voltage Clipping Based SERDES.
Figure 7:
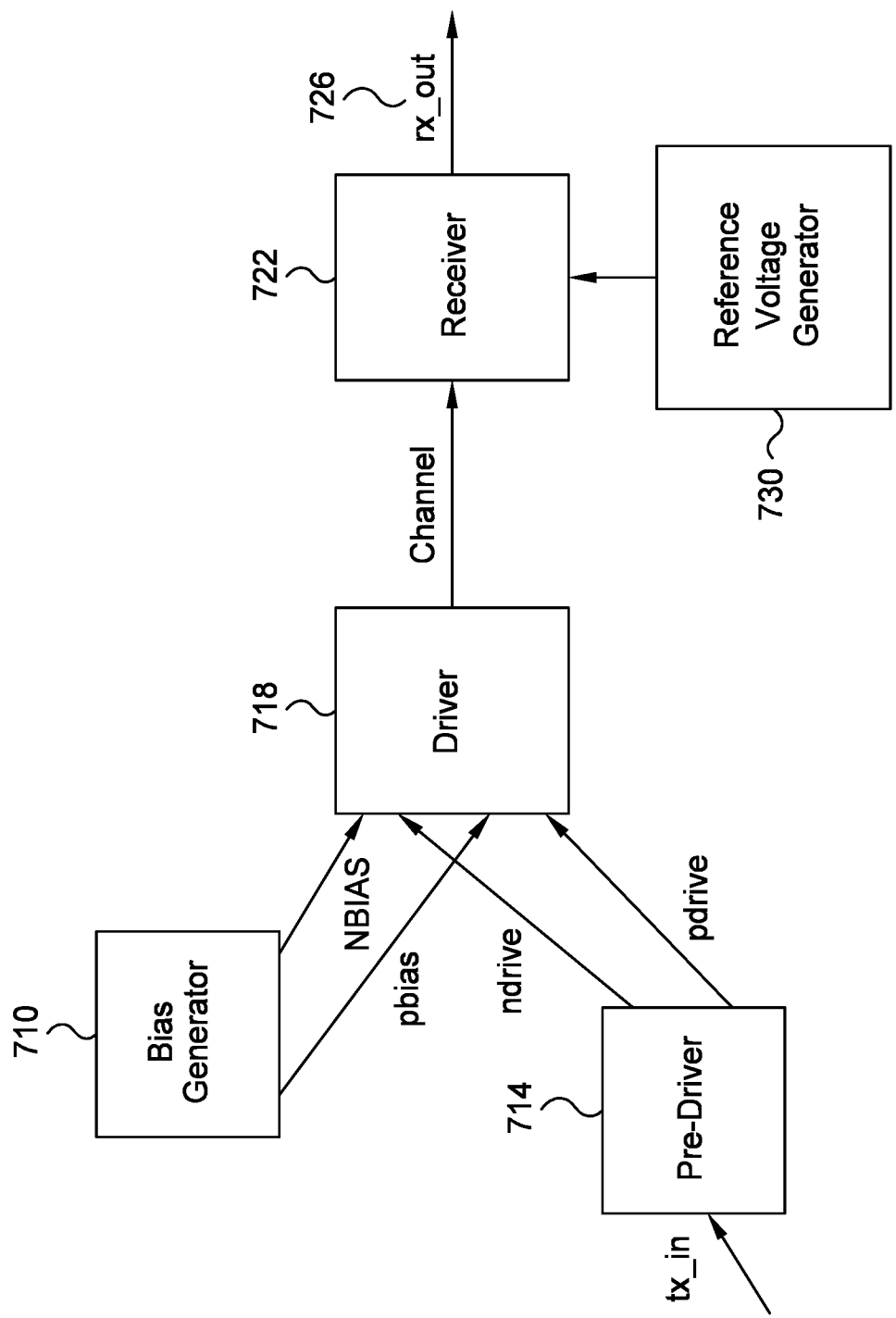
FIG. 7 illustrates an example, according to one example, of a New Signaling Scheme with a Reference Voltage Generator.
Figure 8:
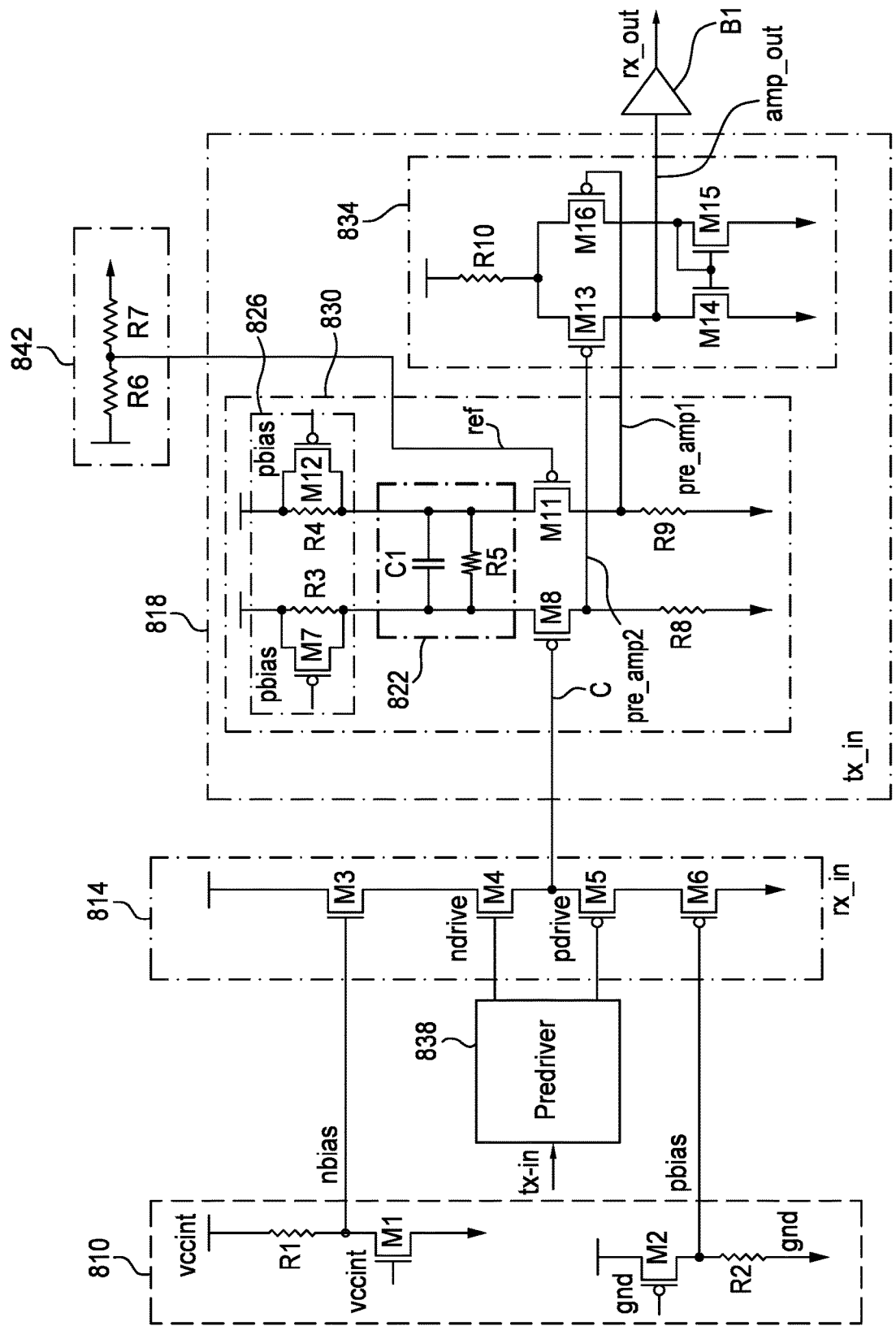
FIG. 8 illustrates an example, according to one example, of a Detailed Implementation of the New Scheme.

FIGS. 6-8 illustrate details of a first embodiment of a new and novel Low Power driver scheme disclosed here. FIG. 6 illustrates a high level diagram of a new Low Power driver scheme.

FIG. 6 is a voltage clipping based, low swing threshold switching voltage-controlled driver (or in some examples, a voltage-controlled transmitter). A low swing voltage threshold, non-return-to-zero voltage-controlled driver limits the voltage swings in standard voltage threshold parallel data between logical 0 and logical 1 to a narrower range than is typically used. Data from this driver can be received reliably using the receiver disclosed here, or any other traditional receiver. Standard voltage threshold parallel data is converted to serialized non-return-to-zero data by a serializer-voltage clipping based driver 610, then transmitted over a metal route 620 less than 1.5 mm long, and then converted back to 8 bit parallel data by a receiver-deserializer 630. In some examples the standard voltage threshold parallel data is 8 bit parallel data.

In one example illustrated in FIG. 7, the embodiment comprises a pre-driver 714, a driver 718, a bias generator 710, a reference voltage generator 730, and a receiver 722.

The pre-driver 714 and receiver 722 can be generic and are included in this disclosure for the sake of completion. Binary data enters the pre-driver 714 at tx_in. The pre-driver 714 serves to control the slew rate of the driver. Ndrive enables the pull-up transistor and Pdrive enables the pull-down transistor.

The role of the bias generator 710 is to supply bias voltages to control the swing voltages and threshold switching voltages of the transmitted binary signal across process and temperature variations. Nbias biases the NMOS pull up transistor and Pbias biases the PMOS pull-down transistor in such a way that the common mode voltage of the driver output does not vary much with process and temperature.

A reference voltage generator 730 is required to generate a voltage close to the threshold switching voltage of the transmitted signals. The reference voltage is close to NRZ logic 1+NRZ logic 0/2. The reference voltage is dependent on the driver NMOS for PMOS ratio and the load, as the behavior of the NMOS and PMOS devices changes with load.

The driver 718 (or in some examples, this may be a transmitter) converts the binary tx_in data to NRZ data. The data is then transmitted over the transmission channel by the driver 718. In some examples, the transmission channel length can be long, such as greater than 1 mm. The transmission channel can be comprised of regular metal lines or an interposer.

The receiver 722 then converts the data back from non-return-to-zero data to a rail to rail signal, where it is then output at rx_out 726.

FIG. 8 illustrates an embodiment of the disclosure designed to transmit data across transmission channel C. It contains bias generator circuitry 810, pre-driver circuitry 838, driver circuitry 814, transmission channel C, receiver circuitry 818 and reference voltage generator circuitry 842.

Serial binary data, at normal CMOS voltage levels, enters the pre-driver circuitry at tx_in. In some examples, the maximum data rate at tx_in is 5 Gbps. The pre-driver circuitry 838 can be a standard buffer capable of driving the driver circuitry 814.

The bias generator circuitry 810 contains a pbias generator circuitry at transistor M2 and a nbias generator circuitry at transistor M1. The driver (i.e. transmitter) circuitry 814 contains N-channel devices M3 and M4 for pull-up and P-channel devices M5 and M6 for pull-down. The nbias voltage biases the NMOS device M3. The nbias voltage is higher for a slow process and higher temperature and lower for a fast process and low temperature. When this voltage is applied to M3, it maintains the drive of this transistor. Similarly, pbias biases the PMOS device M6. The pbias voltage is lower for a slow process and higher temperature and higher for a fast process and low temperature. When this voltage is applied to M6, it maintains the drive of this transistor. The nbias voltage decides the pull-up voltage level and pbias decides the pull-down voltage level. A combination of nbias applied to M3 and pbias applied to M6 decides the threshold switching voltage of the signals. Since M3 and M6 are process and temperature compensated, the threshold switching voltage varies only with voltage and helps in setting a reference voltage for the receiver to reliably receive the incoming signal.

Transmission channel C can be an interposer or a regular metal line. Data is transmitted across transmission channel C in serial form. In some examples, the maximum length of transmission channel C will be up to 5 mm for a 5 Gbps data rate.

The reference voltage generator circuitry 842 is a resistor divider circuitry and the reference voltage is set based on the threshold switching voltage of the incoming signals at $t_x\_in$. The threshold switching voltage is set by the driver circuitry 814 and the capacitance of the transmission channel C.

Transmission channel C connects to the receiver circuitry 818 at transistor M8, which is the input to the receiver circuitry 818. The voltage on transmission channel C at the receiver circuitry 818 input varies very close to the reference voltage REF. The signal swing voltage at transmission channel C is sufficient to translate into a logic 0 or logic 1.

Voltage at the receiver input C varies across voltage very close to the reference voltage REF. signal swing at node C is sufficient to translate into a logic 0 or logic 1.

The receiver circuitry 818 can be any high-speed receiver circuitry having equalization at the frequency of interest. In one example, the receiver circuitry 818 contains a pre-amplifier 830 and an amplifier 834. The pre-amplifier 830 contains a current limiting circuitry 826, and an equalization circuitry 822.

The current limiting circuitry 826 contains a combination of p-channel transistor M7 and R3 for one branch and p-channel transistor M12 and R4 for another branch. The P-channel transistors M7 and M12 are biased using pbias. This helps achieve better immunity with respect to the resistor variation of R3 and R4.

The equalization circuitry 822 contains a resistor R5 and a capacitor C1. R5 and C1 create a "zero". Their values are chosen according to the highest frequency of operation, so that the zero effects an increase in gain. M8 and M11 are the differential pair and R8 and R9 are the resistive load. The pre-amplifier 830 sets the proper threshold switching voltage and differential voltages of the signals pre_amp1 and pre_amp2 to be amplified reliably by amplifier 834. The amplifier 834 has a current limiting resistor R10, a differential pair M13 and M16 and load transistors M14 and M15.

Buffer B1 is used to restore CMOS voltage levels. At $r_x\_out$, the binary data output levels are then normal CMOS voltage levels.

The scheme is designed to work at a common supply voltage for the driver circuitry 814 and the receiver circuitry 818.

Table 1 shows the PPA (Average Power Consumption) comparison between the voltage mode driver in FIG. 4 versus the new scheme in FIG. 6. The Average Power consumption for the new scheme is one third of the Average Power Consumption for the scheme in FIG. 4. The DCD and the area are comparable.

TABLE 1

| PA parameters | Scheme using Voltage Mode Driver | New Scheme |
| --- | --- | --- |
| Area | ~600 sq. um | <600 sq. um |
| DCD | 46.25%-53.56% | 47.1%-52.46% |
| Average Current (XPE corner) | 5.17 mA | 1.56 mA |
| Peak current (XPE corner) | 84.69 mA | 5.1 mA |

It can be observed that the Area numbers are comparable. A dummy device is a device that does not have any IV characteristics. It is placed in between active devices. DECAP devices are decoupling capacitors used for supplying currents to the driver to help EMIR/SIPI. Although the driver size is large for the new scheme due to reverse use of MOS devices, the area is comparable since EMIR closure requires lot of dummy devices and DECAP devices for a voltage mode driver.

The performance is slightly better for the new scheme. However, the average power consumption for the new scheme is less than one-third of the average power consumption of a voltage mode driver. Peak current for the new scheme is less than 1/10th of the peak current of a voltage mode driver. This reduction in driver power is very important for EMIR and SIPI closure and reduces overall power budget for the clock network, global signals, and the chip to chip interface using an interposer.

Figure 9:
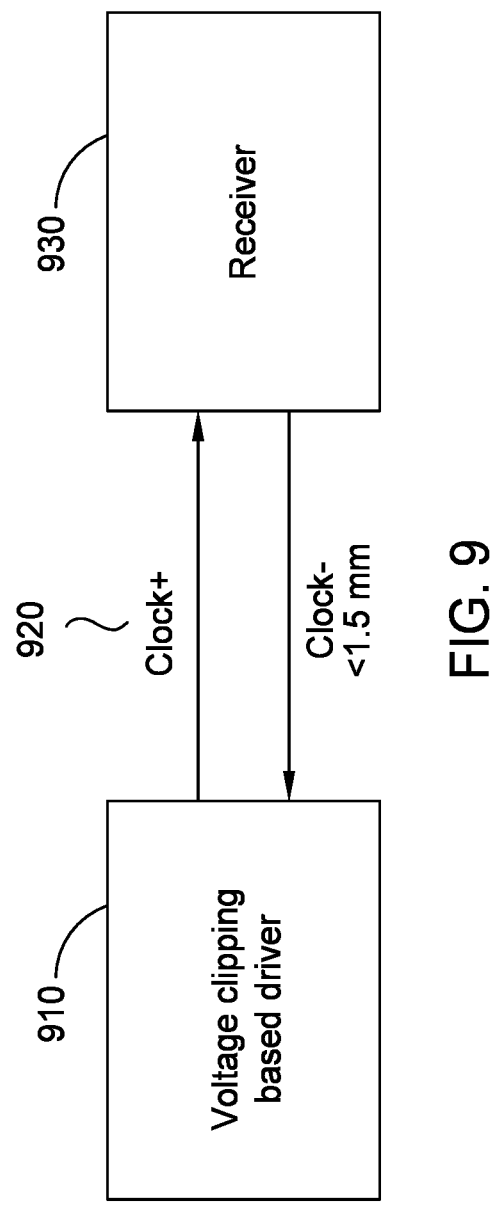
FIG. 9 illustrates an example, according to one example, of a second embodiment of a differential voltage clipping driver scheme.
Figure 10:
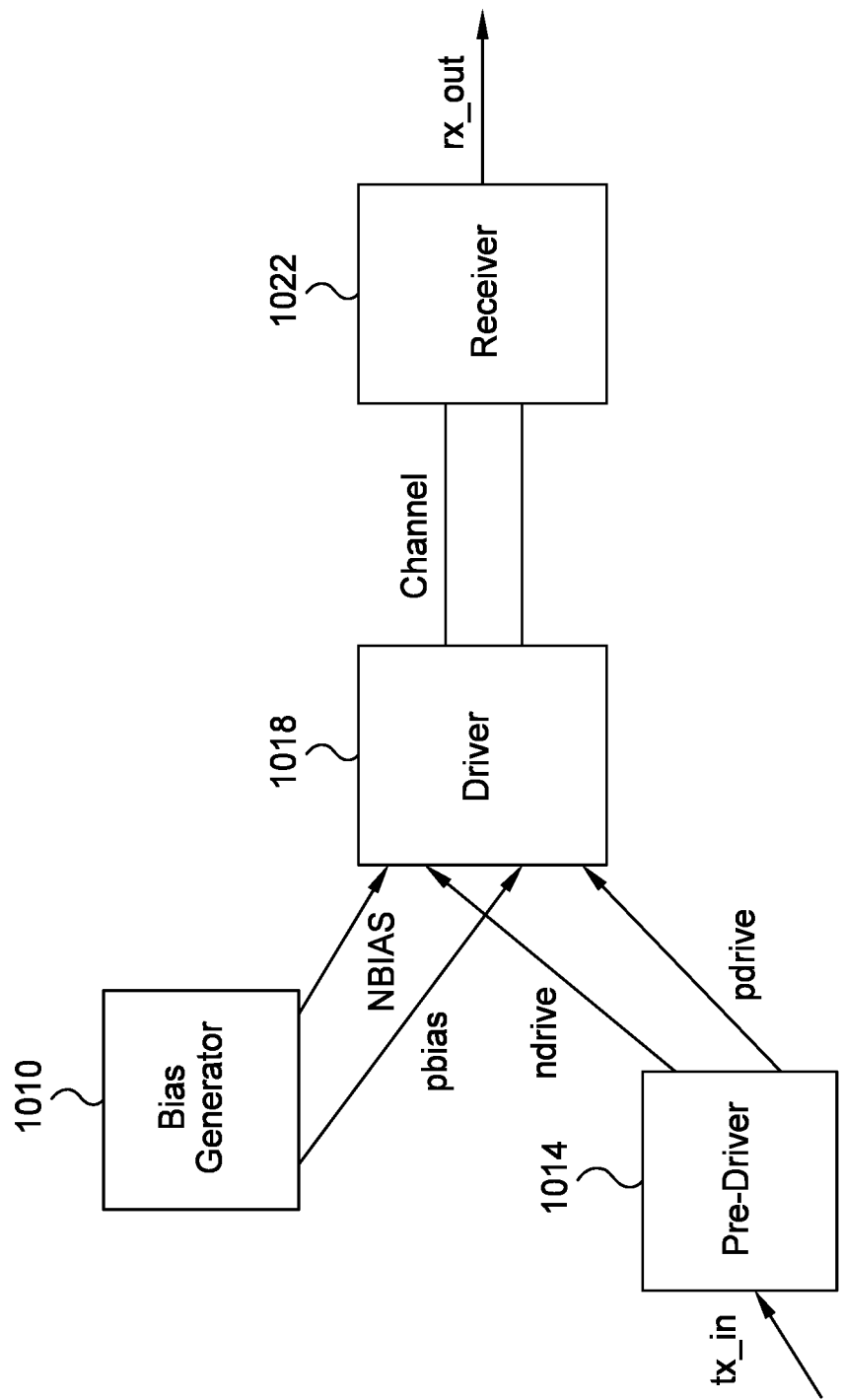
FIG. 10 illustrates an example, according to one example, of a block diagram of a second embodiment of a Differential Voltage Clipping Driver scheme.
Figure 11:
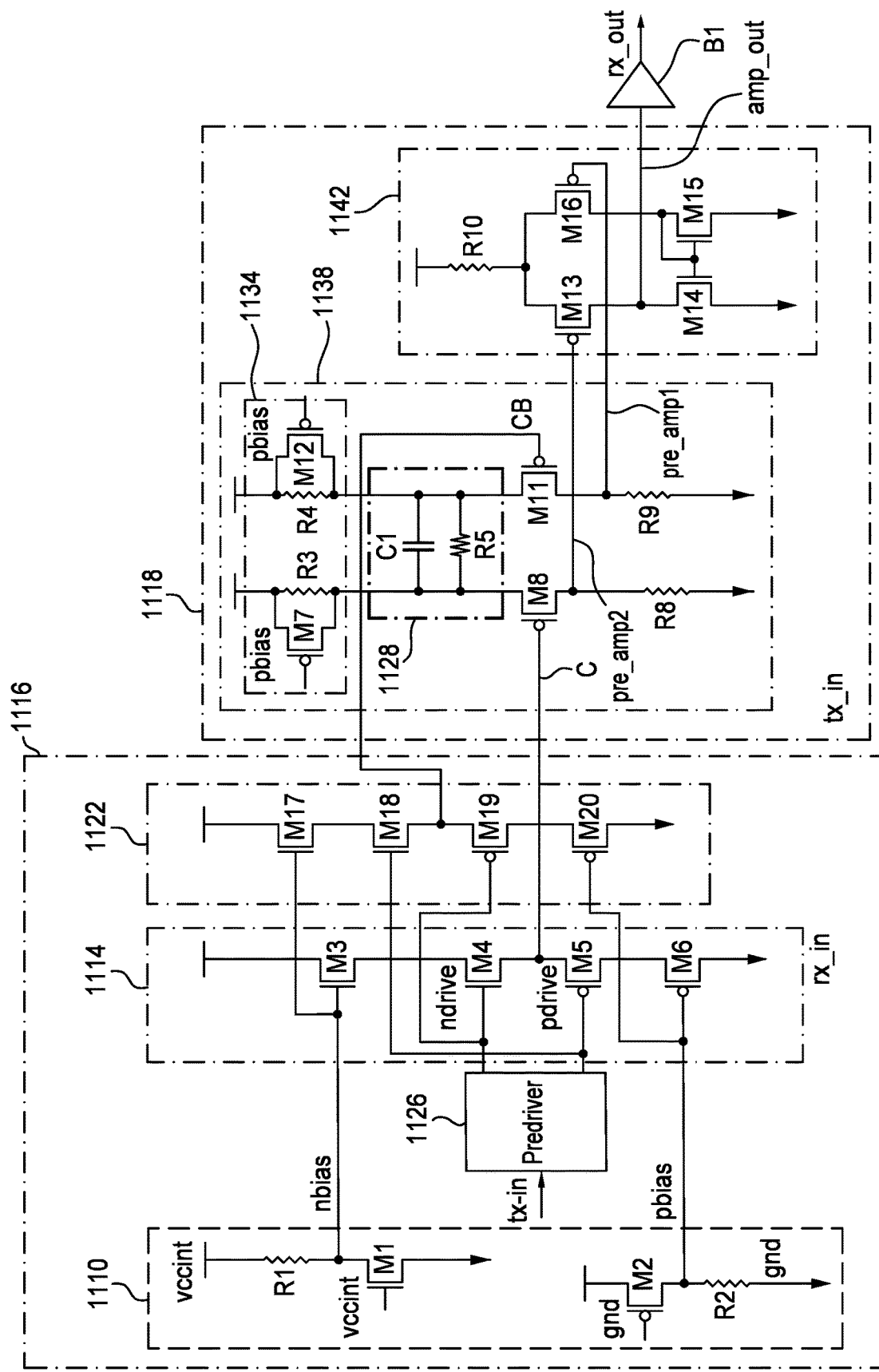
FIG. 11 illustrates an example, according to one example, of a detailed implementation of a second embodiment of a Differential Voltage Clipping Driver scheme.

FIGS. 9-11 illustrate details of a second embodiment of a Low Power driver scheme. This second embodiment discloses a differential voltage clipping driver scheme. In FIGS. 9-11 no reference voltage generator is required for the differential signals.

FIG. 9 illustrates the clock-serialized data that is transmitted using a differential channel. An advantage of this scheme is a low jitter rate. The differential voltage clipping driver 910 is similar to the first embodiment in FIG. 6, except for the fact that it utilizes two wires to transmit non-return to zero differential voltage data. The differential voltage clipping driver 910 can be a clock driver or a driver followed by a serializer for transmitting data.

The differential voltage clipping driver 910 can be a clock driver or a driver followed by a serializer for implementing a data transmitter. Differential voltage parallel data is converted to serialized non-return-to-zero differential voltage data by the differential voltage clipping driver 910, then transmitted over a metal route 920 less than 1.5 mm long, and then converted back to 8 bit parallel data by a receiver 930. In some examples the differential voltage parallel data is 8 bit parallel data.

FIG. 10 illustrates an example, according to one example, of a block diagram of a Low Power driver using a differential voltage clipping driver scheme. In this example, the voltage clipping driver 1018 transmits a differential signal and a receiver receives it. No reference generator is required since differential signals are compared for reception. This embodiment scheme consists of a pre-driver 1014, a voltage clipping driver 1018, a bias generator 1010, and a receiver 1022.

The pre-driver 1014 and receiver 1022 can be generic and are included in this disclosure for the sake of completion. Binary data enters the pre-driver 1014 at tx_in. The pre-driver 1014 serves to control the slew rate of the voltage clipping driver 1018. Ndrive enables the pull-up transistor and Pdrive enables the pull-down transistor.

The role of the bias generator 1010 is to supply Bias voltages to control the swing voltages and threshold switching voltages of the transmitted binary signal across process and temperature variations. Nbias biases the NMOS pull up transistor and Pbias biases the PMOS pull-down transistor in such a way that the common mode voltage of the driver output does not vary much with process and temperature.

The voltage clipping driver 1018, which in some examples may be a data transmitter, converts the binary tx_in data to NRZ data. The data is then transmitted over the transmission channel by the voltage clipping driver 1018. The transmission channel can be regular metal lines or an interposer. In some examples, the transmission channel length can be long, such as greater than 1 mm. The transmission channel can be comprised of regular metal lines or an interposer.

The receiver 1022 then converts the data back from NRZ data to a rail to rail signal, where it is then output at rx_out.

FIG. 11 illustrates an example, according to one example, of a Detailed Implementation of a Low Power driver using a differential voltage clipping driver scheme. bias generator circuitry 1110, pre-driver circuitry 1126, driver circuitry 1122, differential driver circuitry 1116, differential voltage clipping driver circuitry 1114, transmission channel C, and a receiver circuitry 1118 are illustrated.

The differential voltage clipping driver scheme is similar to the first driver scheme above, except for the fact that in the second scheme it outputs differential voltages. The differential voltage clipping driver 1114 can be a clock driver or a driver followed by a serializer for transmitting data.

In this figure, the bias generator circuitry 1110, the driver circuitry 1122, and the differential voltage clipping driver circuitry 1114 combine to realize a differential driver circuitry 1116. reference voltage generator circuitry 842 in FIG. 8 has been removed from FIG. 11, and the differential input CB transmitted by the driver circuitry 1122 is used as a reference for reception in the driver circuitry 1122. driver circuitry 1122 comprises transistors M17-M20. Transistor M17 receives nbias. and transistor M20 receives pbias. Transistor M18 receives the pdrive input and transistor M19 receives the ndrive input from the pre-driver circuitry 1126 to drive the signal on the CB differential input.

Serial binary data, at normal CMOS voltage levels, enters the pre-driver circuitry 1126 at tx_in. In some examples, the maximum data rate at tx_in is 5 Gbps. The pre-driver circuitry 1126 can be a standard buffer capable of driving the differential voltage clipping driver circuitry 1114.

The bias generator circuitry contains a pbias generator circuitry and a nbias generator circuitry. The differential voltage clipping driver circuitry 1114 may be considered a transmitter circuitry, and it contains N-channel devices M3 and M4 for pull-up and P-channel devices M5 and M6 for pull-down. The nbias voltage biases the NMOS device M3. The nbias voltage is higher for a slow process and higher temperature and lower for a fast process and low temperature. When this voltage is applied to M3, it maintains the drive of this transistor. Similarly, pbias biases the PMOS device M6. The pbias voltage is lower for a slow process and higher temperature and higher for a fast process and low temperature. When this voltage is applied to M6, it maintains the drive of this transistor. The nbias voltage decides the pull-up voltage level and pbias decides the pull-down voltage level. A combination of nbias applied to M3 and pbias applied to M6 decides the threshold switching voltage of the signals. Since M3 and M6 are process and temperature compensated, the threshold switching voltage varies only with voltage and helps in setting a reference voltage for the receiver circuitry 1118 to reliably receive the incoming signal.

Transmission channel C can be an interposer or a regular metal line. Data is transmitted across transmission channel C in serial form. In some examples, the maximum length of transmission Channel C will be up to 5 mm for a 5 Gbps data rate.

The receiver circuitry 1118 can be any high-speed receiver circuitry having equalization at the frequency of interest. In one example, the receiver circuitry 1118 contains a Pre-amplifier 1138 and an amplifier 1142. The Pre-amplifier 1138 contains a current limiting circuitry 1134, and an equalization circuitry 1128.

The current limiting circuitry 1134 contains a combination of p-channel transistor M7 and R3 for one branch and p-channel transistor M12 and R4 for another branch. The P-channel transistors M7 and M12 are biased using pbias. This helps achieve better immunity with respect to the resistor variation of R3 and R4.

The equalization circuitry 1128 contains a resistor R5 and a capacitor C1. R5 and C1 create a "zero". Their values are chosen according to the highest frequency of operation, so that the zero effects an increase in gain. M8 and M11 are the differential pair and R8 and R9 are the resistive load. The pre-amplifier 1138 sets the proper threshold switching voltage and differential voltages of the signals pre_amp1 and pre_amp2 to be amplified reliably by amplifier 1142. The amplifier 1142 has a current limiting resistor R10, a differential input pair configured to receive any low swing voltage level using MOS transistors M13 and M16, and load transistors M14 and M15.

Buffer B1 is used to restore CMOS voltage levels. At $r_x$_out, the binary data output levels are then normal CMOS voltage levels.

The scheme is designed to work at a common supply voltage for the driver and the receiver.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

The methods disclosed herein comprise one or more steps or actions for achieving the methods. The method steps and/or actions may be interchanged with one another. In other words, unless a specific order of steps or actions is specified, the order and/or use of specific steps and/or actions may be modified.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuitry, a digital signal processor (DSP), an application specific integrated circuitry (ASIC), or a processor (e.g., a general purpose or specifically programmed processor). Generally, where there are operations illustrated in figures, those operations may have corresponding counterpart means-plus-function components with similar numbering.

The various illustrative logical blocks, modules and circuitrys described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

While the foregoing is directed to specific examples, other and further examples may be devised without departing from the basic scope thereof, and the scope thereof is determined by the claims that follow.

What is claimed is:

1. A method, comprising:
   converting, in a voltage-controlled driver, standard voltage threshold parallel data to serialized non-return-to-zero data;
   biasing, using p-bias generator circuitry of a bias generator, p-channel devices of the driver to control pull-down voltage levels;
   biasing, using n-bias generator circuitry of the bias generator, n-channel devices of the driver to control pull-up voltage levels, wherein the pull-down voltage levels and the pull-up voltage levels, collectively, are configured to adjust a threshold switching voltage;
   transmitting the serialized non-return-to-zero data on a transmission channel to a receiver-deserializer, the receiver-deserializer including a pre-amplifier and an amplifier; and
   converting the serialized non-return-to-zero data to standard voltage threshold parallel data.

2. The method of claim 1, further comprising providing a transmission channel connecting a first chip and a second chip.

3. The method of claim 1, further comprising transmitting serialized, non-return-to-zero differential voltage data.

4. The method of claim 1, wherein the p-channel devices and the n-channel devices are compensated for process variation and temperature variation such that the threshold switching voltage is adjusted only based on the pull-down voltage levels and the pull-up voltage levels.

5. The method of claim 1, wherein the pre-amplifier includes current limiting circuitry and equalization circuitry.

6. The method of claim 5, wherein the current limiting circuitry includes a first p-channel transistor and a first resistor in a first branch and a second p-channel transistor and a second resistor in a second branch, and equalization circuitry includes a capacitor and a third resistor.

7. A device, comprising:
an input for standard voltage threshold parallel data in a pre-driver;
a non-return-to-zero voltage-controlled driver coupled to the pre-driver; wherein the non-return-to-zero voltage-controlled driver is configured to convert standard voltage threshold parallel data to serialized non-return-to-zero data;
a bias generator coupled to the non-return-to-zero voltage-controlled driver, the bias generator including p-bias generator circuitry configured to bias p-channel devices of the driver to control pull-down voltage levels and n-bias generator circuitry configured to bias n-channel devices of the driver to control pull-up voltage levels, wherein the pull-down voltage levels and the pull-up voltage levels, collectively, are configured to adjust a threshold switching voltage;
a transmission channel; and
a data output in a receiver coupled to the transmission channel, wherein the receiver is configured to convert the serialized non-return-to-zero data to standard voltage threshold parallel data, the receiver including a pre-amplifier and an amplifier.

8. The device of claim 7, wherein the pre-amplifier includes current limiting circuitry and equalization circuitry.

9. The device of claim 8, wherein the current limiting circuitry includes a first p-channel transistor and a first resistor in a first branch and a second p-channel transistor and a second resistor in a second branch, and the equalization circuitry includes a capacitor and a third resistor.

10. The device of claim 7, further comprising a reference voltage generator configured to generate a reference voltage close to the threshold switching voltage.

11. A device, comprising:
a non-return-to-zero voltage-controlled driver configured to convert standard voltage threshold parallel data to serialized non-return-to-zero data; and
a bias generator including p-bias generator circuitry configured to bias p-channel devices of the driver to control pull-down voltage levels and n-bias generator circuitry configured to bias n-channel devices of the driver to control pull-up voltage levels, wherein the pull-down voltage levels and the pull-up voltage levels, collectively, are configured to adjust a threshold switching voltage; and
a transmission channel from the non-return-to-zero voltage-controlled driver to a receiver-deserializer, wherein the receiver-deserializer is configured to convert non-return-to-zero data to standard voltage threshold parallel data.

12. The device of claim 11, wherein the transmission channel further comprises:
a channel connecting a first chip and a second chip.

13. The device of claim 11, wherein the serialized non-return-to-zero data further comprises serialized, non-return-to-zero differential voltage data.

14. The device of claim 11, wherein the p-channel devices and the n-channel devices are compensated for process variation and temperature variation such that the threshold switching voltage is adjusted only based on the pull-down voltage levels and the pull-up voltage levels.

15. The device of claim 11, wherein the receiver-deserializer includes a pre-amplifier and an amplifier, the amplifier including current limiting circuitry and equalization circuitry.

16. The device of claim 15, wherein the current limiting circuitry includes a first p-channel transistor and a first resistor in a first branch and a second p-channel transistor and a second resistor in a second branch, and the equalization circuitry includes a capacitor and a third resistor.

17. The device of claim 11, wherein the standard voltage threshold parallel data comprises CMOS voltage levels.

18. The device of claim 11, further comprising:
a pre-driver coupled to the non-return-to-zero voltage-controlled driver; and
a reference voltage generator coupled to the receiver-deserializer.

19. The device of claim 18, wherein the bias generator is configured to supply the threshold switching voltage of the transmitted non-return-to-zero data.

20. The device of claim 18, wherein the reference voltage generator is configured to generate a reference voltage close to the threshold switching voltage.

* * * * *